United States Patent [19]
Spigarelli et al.

[11] Patent Number: 5,278,938
[45] Date of Patent: * Jan. 11, 1994

[54] INFRARED HEATER ARRAY FOR IC SOLDERING REFLECTIVE MEMBERS

[75] Inventors: Donald J. Spigarelli, Carlisle, Mass.; John M. DeCarlo, York, Me.; Karl E. Bahr, Hooksett, N.H.

[73] Assignee: Sierra Research and Technology, Inc., Westford, Mass.

[*] Notice: The portion of the term of this patent subsequent to Oct. 22, 2008 has been disclaimed.

[21] Appl. No.: 660,657

[22] Filed: Feb. 22, 1991

Related U.S. Application Data

[63] Continuation-in-part of Ser. No. 573,500, Aug. 27, 1990, Pat. No. 5,060,288.

[51] Int. Cl.[5] .................................. F26B 3/30
[52] U.S. Cl. .................................. 392/420; 392/412; 392/413; 219/85.12
[58] Field of Search .................. 392/419–421, 423, 424, 411–413, 418; 219/85.12, 85.13; 362/298, 282–284

[56] References Cited

U.S. PATENT DOCUMENTS

| | | | |
|---|---|---|---|
| 2,861,166 | 11/1958 | Cargill, Jr. | 219/34 |
| 3,283,124 | 11/1966 | Rawecki | 219/85.12 |
| 3,586,813 | 6/1971 | Cruickshank et al. | 219/85 |
| 3,592,992 | 7/1971 | Costello | 219/85 |
| 3,683,146 | 8/1972 | Nugent et al. | 219/85 |
| 3,718,800 | 2/1973 | Costello | 219/85 |
| 4,650,950 | 3/1987 | Hayakawa et al. | 219/85.12 |
| 4,685,200 | 8/1987 | Bokil | 437/215 |
| 4,720,617 | 1/1988 | Hayakawa et al. | 219/85 BA |
| 4,960,972 | 10/1990 | Nakamura et al. | 219/85.12 |

FOREIGN PATENT DOCUMENTS

| | | | |
|---|---|---|---|
| 62-3269 | 1/1987 | Japan . | |
| 62-113866 | 7/1987 | Japan . | |
| 62-219464 | 3/1989 | Japan | 219/85.12 |
| 1459832 | 2/1989 | U.S.S.R. | 219/85.12 |
| 2038220 | 7/1980 | United Kingdom | 219/85.12 |

Primary Examiner—Bruce A. Reynolds
Assistant Examiner—John A. Jeffery
Attorney, Agent, or Firm—Weingarten, Schurgin, Gagnebin & Hayes

[57] ABSTRACT

An infrared (IR) heater array apparatus that provides focused lines of IR radiation for soldering integrated circuit components or devices, especially fine pitch integrated circuit devices (FPD), in aligned combination with printed circuit boards. The apparatus is configured for concentric mounting in combination with the placement head of placement apparatus wherein FPDs and other IC devices may be bonded to the circuit board while the device is held in place by the placement apparatus. One preferred embodiment of the apparatus includes an array of IR lamps and associated lamp envelopes and lenses, together with control apparatus for operating the IR lamps and aligning the focused IR radiation generated thereby. The radiation generated by the IR lamps is configured to provide a desired line pattern of energy which is directed onto the leads of a device being soldered. The perimeter of the energy pattern is programmably alterable to suit particular device lead sizes and configurations.

20 Claims, 7 Drawing Sheets

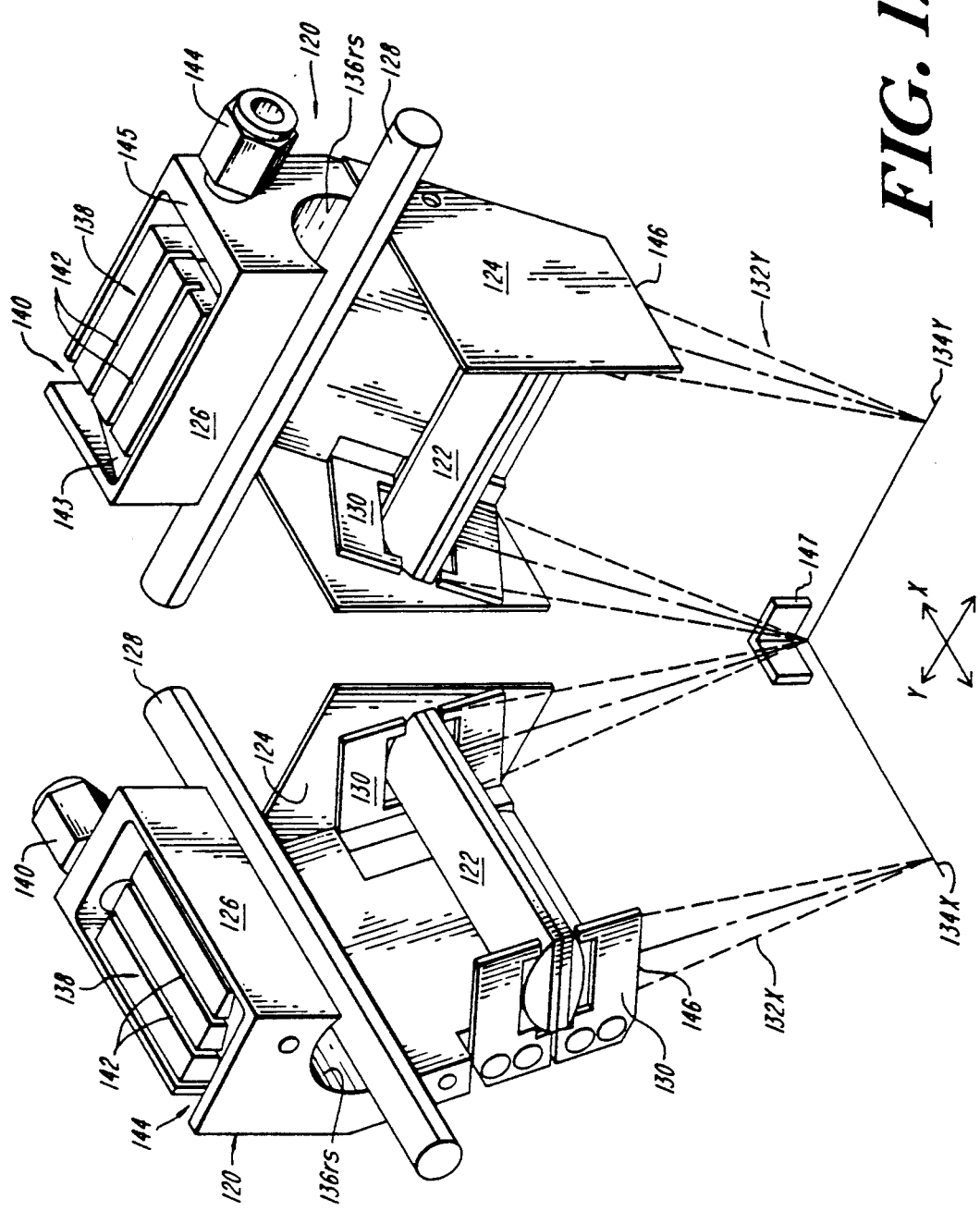

INFRARED HEATER ARRAY FOR IC SOLDERING REFLECTIVE MEMBERS

RELATED APPLICATIONS

This application is a continuation-in-part of commonly owned, co-pending patent application Ser. No. 07/573,500 filed Aug. 27, 1990, now U.S. Pat. No. 5,060,288, issued Oct. 21, 1991 and is related to commonly owned, co-pending patent application entitled System For placement and Mounting of Fine pitch Integrated Circuit Devices, Ser. No. 07/573,459.

FIELD OF THE INVENTION

The present invention relates generally to radiation heaters, and more particularly, to an infrared heater array apparatus that provides focused lines of IR radiation for precisely soldering integrated circuit devices in aligned combination with printed circuit boards.

BACKGROUND OF THE INVENTION

Component placement systems are utilized to place and align components such as integrated circuit (IC) devices in combination with printed circuit boards. An important operating consideration for placement systems is the degree of accuracy in component placement, i.e., lead-to-pad alignment.

Advances in integrated circuit architecture and miniaturization has resulted in greater numbers of functions being encompassed on single chips, necessitating the use of chips of larger dimensions, increased lead density, and/or reduced lead pitch. The increasing use of fine pitch integrated circuit devices (FPD), which presently have lead pitches on the order of 0.025 inches, and the projected use of FPDs having lead pitches on the order of 0.008 inches, has increased placement accuracy requirements for component placement systems.

Once a component has been properly aligned on a circuit board, the component must be bonded, for example by reflow soldering, to the circuit board. An important consideration in the bonding operation is the maintenance of the proper lead-to-pad alignment. Bonding may be accomplished by any of several methods.

The circuit board may be transported off the placement system to a mass reflow machine for subsequent bonding. Alternatively, selective reflow techniques may be utilized to bond the component prior to transporting the circuit board off the placement system. Or, the component may be reflow soldered at the time of placement utilizing a bonding subsystem integrally mounted with the placement system.

The third alternative is usually the most advantageous. Lead-to-pad misalignment may occur when a component is released after being placed and aligned, and/or when the circuit board is subjected to further handling prior to bonding. Reflowing to bond the component to the circuit board while the component is maintained in alignment by the placement apparatus significantly reduces or eliminates lead-to-pad misalignment problems.

The desire to provide bonding while the component is being held in place by the placement apparatus has generated a need for a bonding subassembly that may be mounted in combination with the placement head of the placement system. This imposes a design constraint on the bonding subassembly wherein the bonding subassembly must be configured for concentric disposition and operation with the placement head of the placement system. Concentric disposition and operation of the bonding subassembly would permit unimpeded operation of the pickup tool and image acquisition subassembly during both placement and soldering operations, thus ensuring initial lead-to-pad alignment as well as the maintenance of proper lead-to-pad alignment during the bonding operation.

Successful and cost effective implementation of an integral bonding subassembly in combination with a component placement system is influenced by the component size, component range, lead type, lead pitch, lead count, circuit board type, circuit board component mix, and circuit board topography, and the nature of the apparatus utilized to provide the thermal energy for the soldering operation. Different methods of providing thermal reflow energy are not necessarily suited to all applications inasmuch as the different methods provide different performance characteristics.

Performance characteristics such as programmability of heating, temperature control, temperature uniformity, thermal separation, packaging restrictions, and cycle time and cost should be considered in determining the type of bonding subassembly for use in integral combination with the placement system. Programmability of heating includes the capability to automatically or manually vary the pattern of heating to the component as well as the ability to program and vary heating parameters such as time and temperature on a component by component and/or site by site basis. Temperature control is the degree to which the temperature of the heating element and/or board can be controlled or predicted as well as the uniformity of the heat being delivered to the board. Thermal separation is the degree to which heating can be limited to the area of interest such as the component leads, thereby avoiding heating in undesired areas such as the component package and/or adjacent solder joints.

Packaging restrictions relate to the effective range of the heating method such as the sizes of component packages the subassembly is capable of handling, the proximity of the heating elements to the heating sites and potential interference with components on the board. Cycle time relates to the time required to bring the site to reflow temperature and cycle cost includes initial equipment costs, maintenance costs, and tooling costs.

Several different means of generating thermal energy for bonding of components to circuit boards may be utilized in an integral bonding subassembly including hot gas heating, contact heating and radiation heating. Hot gas heaters are available in various configurations, but the configuration most conducive to an integral soldering subassembly is a focused hot gas apparatus.

The hot gas apparatus consists of a linear array of orifices with electrical heating elements in each orifice to heat gas forced through the orifices. The gas flow is highly directional and selective operation of the various orifices and associated heating elements may be utilized to generate required hot gas heating patterns. While a focused hot gas apparatus generally provides the capability for programmable heating and reasonable thermal separation and cycle times, such apparatus have inherent limitations.

A focused hot air gas apparatus is generally a more complex system that requires precise regulation of the gas flow through the operational orifices, is limited in temperature control and subject to packaging restrictions. In general, such an apparatus has a very limited effective range due to dispersion and cooling of the gas flow. Dispersion and cooling effects engender concomitant difficulties in predicting and/or regulating the temperature at the bonding site and ensuring a uniform temperature at the bonding site. The limited effective range necessitates mounting of the apparatus in close proximity to the bottom of the placement head which may interfere with the operation of the pickup tool and/or image acquisition system. In addition, the kinetic energy of the heated gas flow may negatively impact the bonding procedure by disrupting or splattering the reflow material and/or causing misalignment problems due to inadvertent movement of the leads.

Contact heaters involve the use of heated blade edges which contact the leads and board. The blades may be heated by electrical resistance (thermode) or hot gas (convector). Contact heaters in general provide fast cycle times and excellent thermal separation. The configuration of the blades, however, limits the use of contact heaters to a very narrow range of component sizes. Alternatively, a separate mechanical positioning subsystem is required to move the blades to ensure contact with all of the leads of different sized components which adversely affects cycle time. In addition, the blades may interfere with the image acquisition subsystem during the actual reflowing bonding procedure. The blades physically contacting the leads of the component may also cause the leads to shifted out of alignment with the pads.

Radiation heating systems utilize the thermal energy of electromagnetic radiation to facilitate lead-to-pad bonding. Prior art radiation heating systems generally were not efficient, were not easily automated and/or did not provide good thermal separation. One prior art radiation system utilizes a mask that exposes the bonding sites while covering the remainder of the IC package and the immediately surrounding circuit board. Such a system requires a customized mask for each different type of IC package, and in consequence, such a system has relatively long cycle times and was not amenable to automation. In addition, such a system did not efficiently utilize the generated IR radiation since much of the radiation was reflected from the mask. Mask systems also required some type of means for dissipating radiation reflected by the mask.

Another type of IR heating system utilized a lens to focus the radiation as a spot encompassing the component and its leader. Due to the linear orientation of the bonding sites of typical IC packages, such a lens system is not readily amenable to providing IR radiation for linearly arranged bonding sites. Instead, such a system generally irradiated the entire IC package and the surrounding circuit board. Such systems did not efficiently utilize the generated IR radiation and did not provide good thermal separation.

SUMMARY OF THE INVENTION

The IR heater array apparatus of the present invention generates focused lines of infrared (IR) radiation that provide excellent thermal separation at the bonding sides. The focused IR radiation pattern provided by the apparatus of the invention has a linear configuration of minimal width, thus making it eminently suitable for use with IC packages having X and Y linearly-orientated bonding sites. The apparatus provides good temperature control and uniformity at the bonding sites and is readily adaptable to automation under computer control. Both the heating parameters and the heating pattern of the apparatus may be automatically or manually varied. The apparatus is capable of accommodating IC packages of varying sizes and handing IC packages having a variety of lead configurations.

In addition, the configuration of the IR heater array apparatus facilitates concentric mounting of the apparatus in combination with the placement head of placement system. The apparatus is readily integrable with existing ballistic type placement systems that utilize a movable placement head.

The apparatus is especially well suited for use in combination with guidance type placement apparatus as described and claimed in commonly-owned, co-pending patent application entitled System For placement and Mounting of Fine pitch Integrated Circuit Devices, U.S. Ser. No. 07/573,459. One embodiment of a guidance type placement apparatus described in the foregoing application includes a base with an X, Y movable table, a fixed placement head that includes a concentrically disposed component pickup subassembly and a concentrically disposed image generation subassembly, and electronic control subsystems.

The guidance type placement system described in this application is well suited to incorporate an integral bonding subassembly. The placement head is fixed in position, necessary movements of the component and circuit board being provided by the X, Y movable table. In addition, the image acquisition subsystem is disposed and operative to provide visual viewing of the final placement operation as well as pre and post-views of the bonding operation.

The described embodiment of the IR heater array apparatus according to the present invention includes four individual IR subassemblies, opposed pairs of X, U reflecting members, a frame member, a base member and control subsystems for controlling the operation of the IR subassemblies and aligning the focused IR radiation generated thereby. The IR subassemblies and reflecting members are disposed concentrically about and spaced apart from the central axis of the placement head. Each IR subassembly includes a linear IR lamp for generating line source IR radiation having predetermined parameters and a lamp envelope. The IR lamp is mounted within a lamp envelope that is configured to focus the generated line source IR radiation into a heating pattern that essentially comprises a straight line of minimum width, such a pattern ensuring excellent thermal separation at the bonding sites.

Another embodiment of the invention employs an IR subassembly having a linear IR lamp and associated lamp envelope cooperative with a lens for focusing the linear lamp radiation to provide a heat pattern directed essentially only onto the lead arrays of the device being worked on. The IR subassemblies are adjustable in the X, Y and Z directions to selectively provide a perimeter pattern of energy according to the particular size and configuration of the device being worked on.

DESCRIPTION OF THE DRAWINGS

A more complete understanding of the present invention and the attendant advantages and features thereof will be more readily understood by reference to the following detailed description when considered in conjunction with the accompanying drawings wherein:

FIG. 12 is a perspective view of two of the IR subassemblies employing lenses according to the present invention.

DETAILED DESCRIPTION OF PREFERRED EMBODIMENTS

Figure 1:
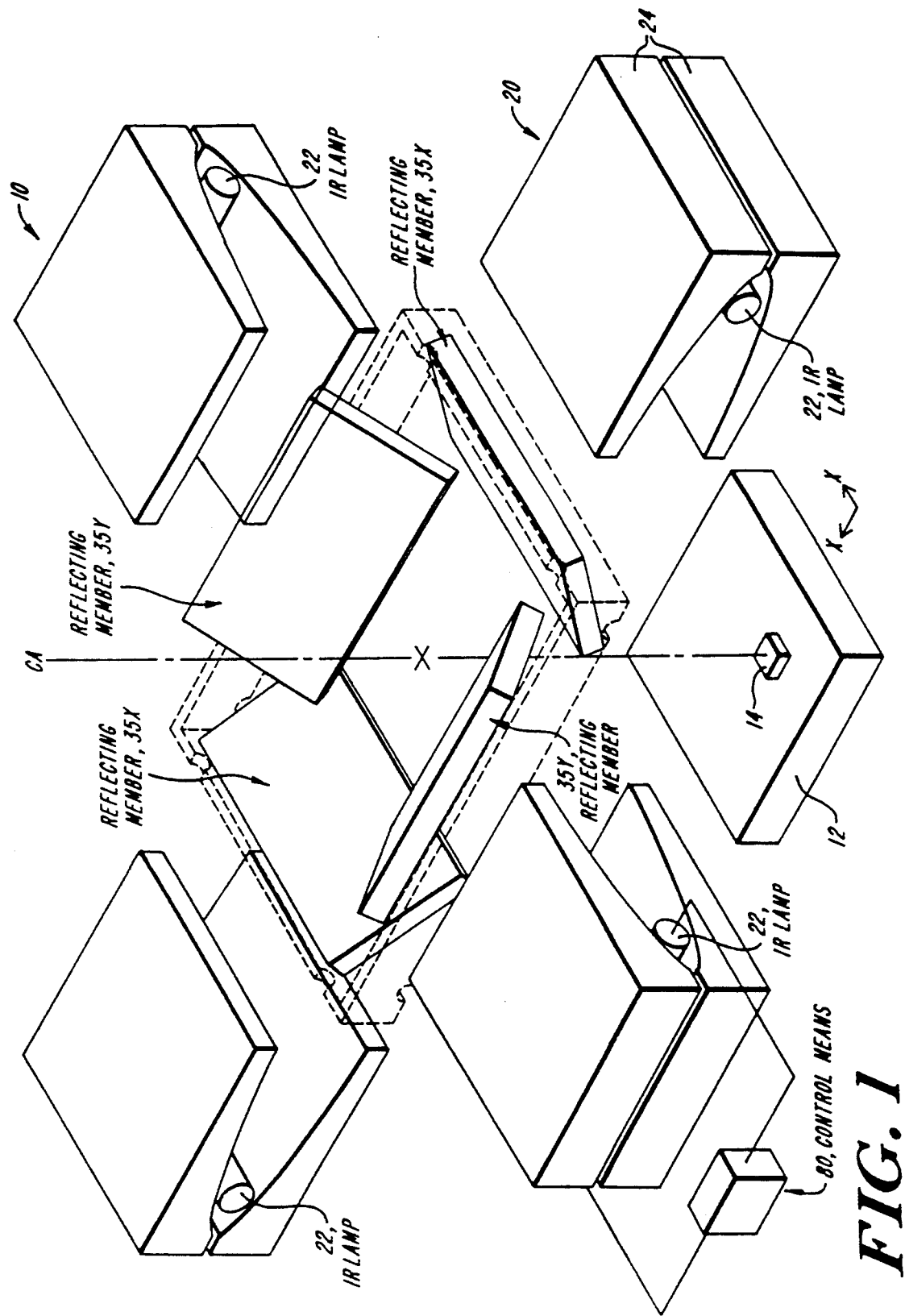
FIG. 1 is a perspective view of the IR generating/focusing components of the IR heater array apparatus.

Referring now to the drawings wherein like reference numerals designate corresponding or similar elements throughout the several views, FIGS. 1-10 illustrate a first embodiment of an IR heater array apparatus 10 according to the present invention.

Figure 9:
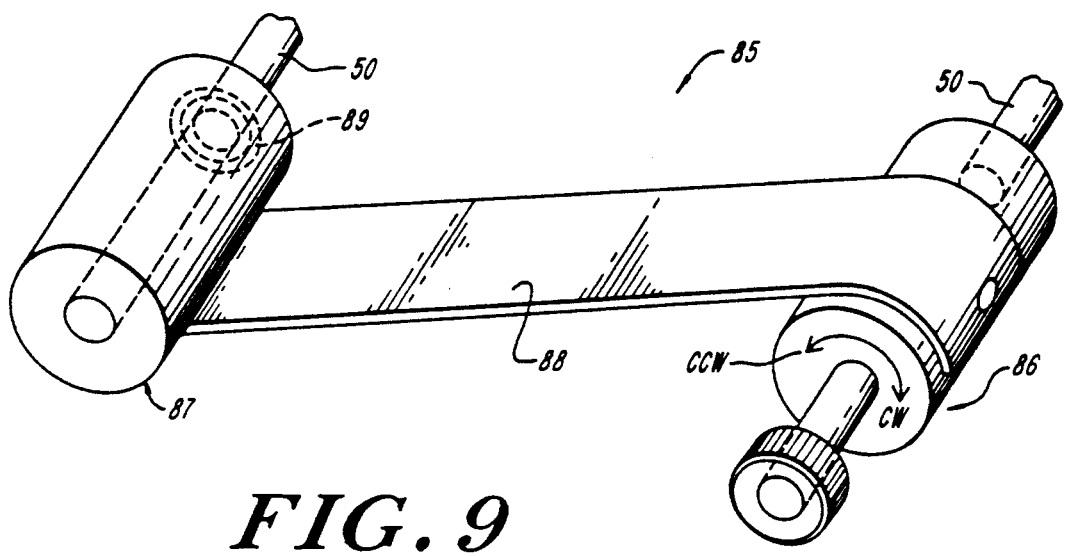
FIG. 9 is a perspective view of an adjusting mechanism for the opposed pairs of X, Y reflecting members.
Figure 10:
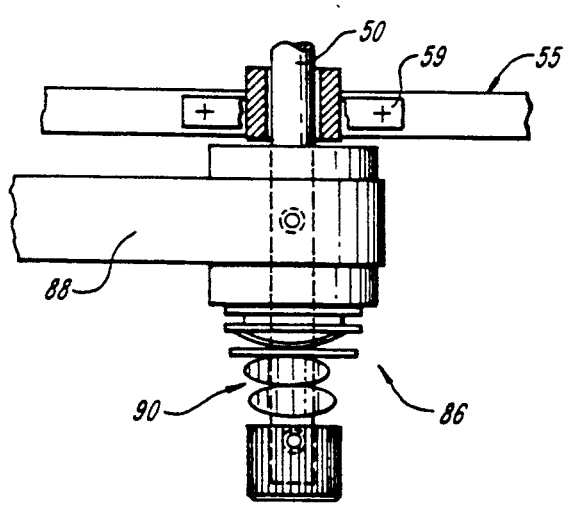
FIG. 10 is a partial plan view of the adjusting mechanism of FIG. 9.
Figure 11:
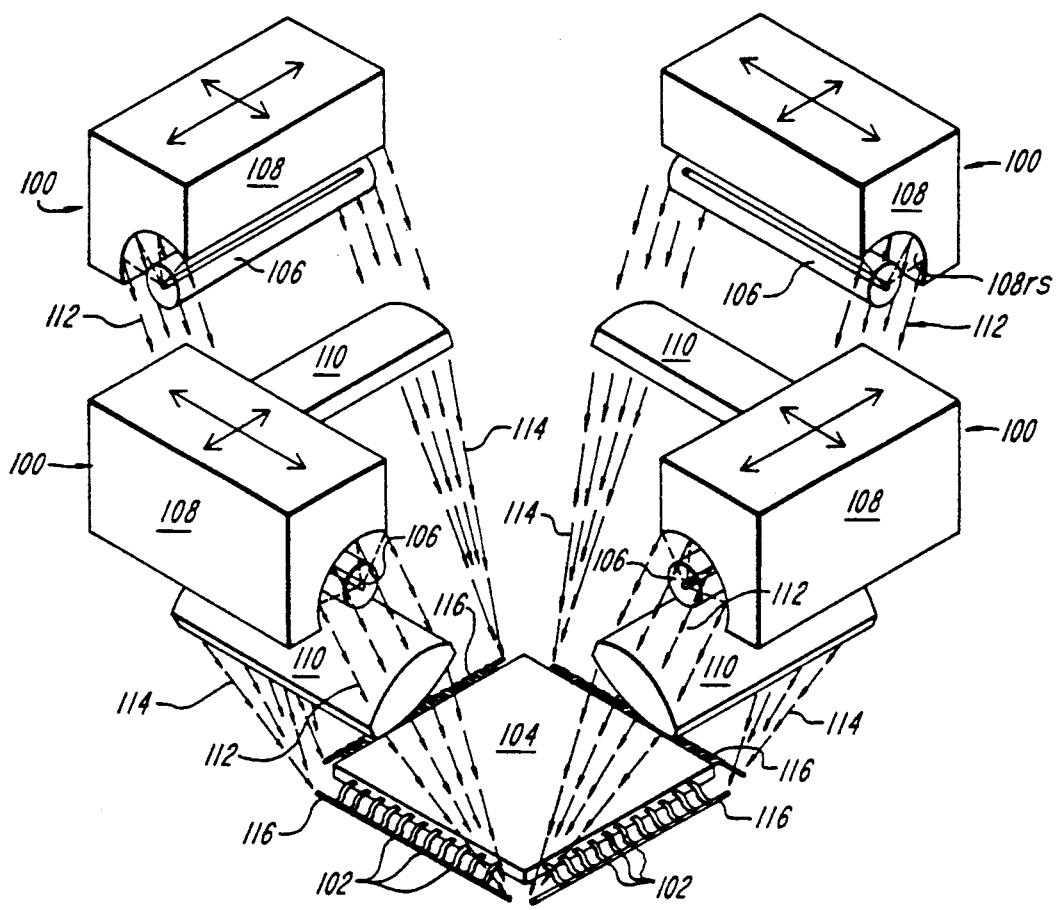
FIG. 11 is a perspective view of the IR generating-/focusing components of the IR heater array apparatus employing lenses.

FIGS. 11 and 12 illustrate a second embodiment of the present invention. Referring first to FIGS. 1-10, the apparatus 10 provides focused lines of infrared (IR) radiation for bonding of integrated circuit components or devices, especially fine pitch integrated circuit devices (FPD), in aligned combination with printed circuit boards. While the present disclosure is presented in terms of bonding of components onto circuit boards, it will be appreciated that the focused IR radiation generated by the IR heater array apparatus of the present invention may also be utilized to desolder components from circuit boards for repair and/or rework.

FIGS. 1-10 illustrate exemplary embodiments of the IR heater array apparatus 10 configured for concentric mounting in combination with the placement head of a placement apparatus (not shown) wherein FPDs and other IC components 14 may be bonded to a circuit board 12 while being held in position by the placement apparatus. As illustrated in FIG. 1, the IR heater array apparatus 10 has a configuration that facilitates concentric mounting of the apparatus 10 in combination with the placement head adjacent the outer perimeter thereof. The dashed line CA represents the central axis of the placement head.

The IR heater array apparatus 10 depicted in FIGS. 1-10 and described hereinbelow has a configuration that facilitates reflow bonding of square or rectangular IC devices that have leads extending outwardly from all four sides of the package. The IR heater array apparatus 10 includes four IR subassemblies 20, opposed pairs of X, Y reflecting members 35, a frame member 55 for rotationally mounting the reflecting members 35 see FIG. 7), a base member 70 (see FIG. 7), and control subsystems 80, 85 for operating the IR subassemblies 20 and aligning the IR radiation generated thereby. Both the IR subassemblies 20 and the X, Y pairs of reflecting members 35 are disposed concentrically about and spaced apart from the central axis CA.

Figure 2:
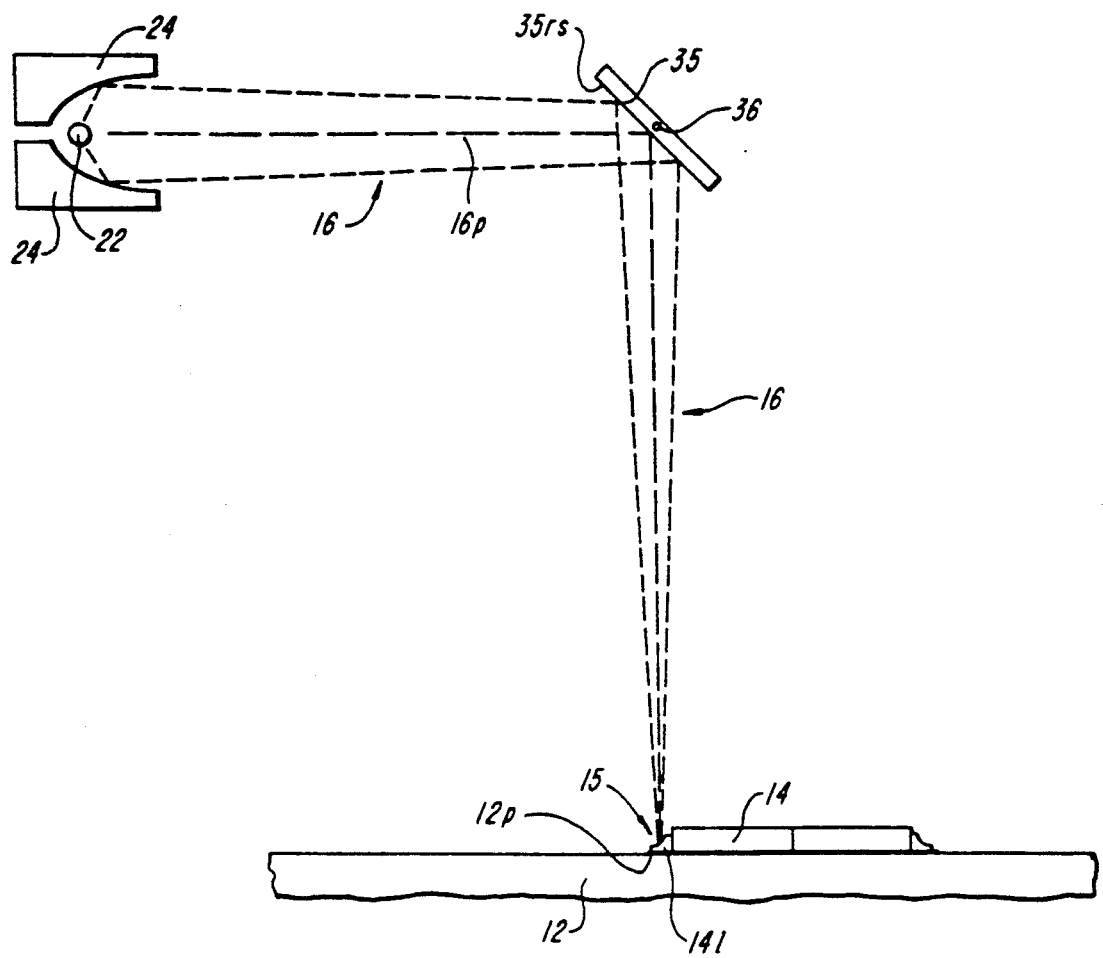
FIG. 2 is a plan view illustrating focusing of IR radiation onto bonding sites.

The various features and operation of the IR subassemblies 20 and the reflecting members 35 in providing focused IR radiation are schematically illustrated in FIGS. 1 and 2. The illustrated IR subassemblies 20 include four IR lamps 22 disposed in a rectangular array about, and spaced apart from, the central axis CA for generating IR radiation. A lamp envelope 24 is associated with each IR lamp 22 and configured to convergingly reflect IR radiation 16 outwardly from the IR lamp 22. A reflecting member 35 is associated with each IR lamp 22, and the reflecting members 35 are disposed as opposed X, Y pairs 35X, 35Y about, and spaced apart from, the central axis CA.

Figure 3:
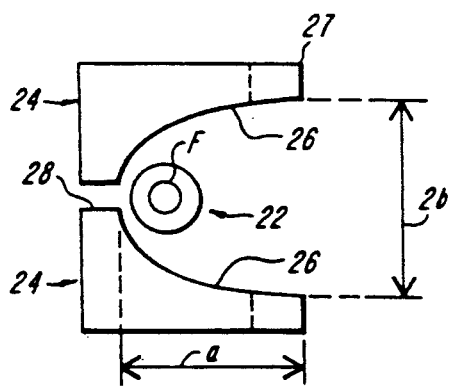
FIG. 3 is a plan view of an IR subassembly according to the present invention.

As illustrated in FIG. 2, IR radiation 16 from each IR subassembly 20 is directed onto the reflective surface 35rs of the corresponding reflecting member 35X, 35Y (the principal ray 16p impinging at the rotational axis 35r of the reflecting member 35), and reflected therefrom to focus onto bonding sites 15. As used herein, the bonding sites 15 are the aligned combination Of the leads 141 of the component 14 to be bonded to the circuit board 12 and the corresponding pads 12p of the board 12. The pads 12p may include solder or solder paste which is fluidized by the energy of the IR radiation 16. The fluidized solder hardens upon termination of the IR radiation 16 to bond the leads 141 in fixed combination with corresponding pads 12p. dAn exemplary IR subassembly 20 is illustrated in FIG. 3 and includes the IR lamp 22 and the lamp envelope 24. The IR lamp 22 illustrated has an elongated cylindrical configuration and dimensions of about 2.5 inches in overall length, an outer diameter of about ⅜ inch and a filament diameter of about 1/16 inch. The IR lamp 22 may be a quartz halogen type lamp operating capable of providing IR radiation, for example a Q500 T3/CL marketed by GE which operates at 120V with a 500 watt output.

The operation of the IR lamps 22 is regulated by control U means 80 (only one IR subassembly 20 is electrically interconnected to the control means 80 in FIG. 1 to reduce the complexity of the drawing) to provide IR radiation 16 having predetermined characteristics such as IR power level, cycle time, wavelength, etc. The control means 80 may be any conventional control subsystem which provides the capability to regulate, either manually or automatically, the characteristics of the generated IR radiation.

Each IR lamp 22 is mounted within a lamp envelope 24 that has a reflecting surface 26 configured for focusing the line source IR radiation generated by the IR lamp 22 to a straight line heating pattern of minimal width at a predetermined focal plane fp. As will be discussed in further detail hereinbelow, the focal plane fp of the focused IR radiation 16 generated by each IR subassembly 20 illustrated is essentially a straight line of minimal width extending in the X or y direction, respectively. The IR subassemblies 20 are mounted and orientated such that, in combination with the corresponding reflecting member 35, the focal plane fp of the IR radiation 16 from each IR subassembly 20 may be aligned to coincide with the bonding sites 15 of a selected IC device.

The inventors have determined that a reflecting surface 26 having a partial elliptical configuration is effective to convergingly reflect sufficient IR radiation generated by the IR lamp 22 onto the bonding sites 15 for the bonding process. The reflecting surface 26 exemplarily illustrated in FIG. 3 has a hemi-elliptical configuration and may be defined by the ellipse equation, $y +/- (b/a)(a^2-x^2)^{1/2}$. The IR lamp 22 is positioned at one foci F, the gap at the ends of the reflecting surface 26 has a dimension defined by parameter 2b, and the overall depth of the reflecting surface 26 has a dimension defined by parameter a. The other foci of the hemi-elliptical reflecting surface 26 is the focal plane fp discussed hereinabove. For the embodiment illustrated, the hemi-elliptical reflecting surface 26 has a focal length, i.e., straight line distance between the foci F and the focal plane fp, of about 7-8 inches.

As illustrated in FIG. 3, the ends of the reflecting surface 26 lie in a plane that passes through the center of the ellipse as described in the preceding paragraph. The inventors have determined that the reflecting surface 26 may be truncated and, while some IR radiation will be lost due to truncation, sufficient focused IR radiation 16 will be provided by the truncated hemi-elliptical reflecting surface 26 for the bonding operation. Reference numeral 27 in FIG. 3 illustrates an exemplary portion of the hemi-elliptical reflecting surface 26 that may be removed for particular applications. This truncated embodiment of the lamp envelope 24 may be utilized for those applications wherein spacing dimensions between the IR subassembly 20 and the frame member 55 must be minimized due to operational constraints and/or the configuration of the placement apparatus.

The hemi-elliptical configuration of the reflecting surface 26 reflects radiation generated by the IR lamp 22 to converge at the focal plane fp. With reference to FIG. 2, the IR subassembly 20 and the corresponding reflecting member 35 are mounted and orientated, as discussed in further detail hereinbelow, so that the focal plane fp coincides with the respective X or y orientated bonding sites 15 of the IC device 14 to be soldered to the circuit board 12. The focused lines of IR radiation generated by the IR subassemblies 20 of the present invention provide excellent thermal separation at the bonding sites 15.

Each lamp envelope 24 includes an air gap 28. The air gap 28 is dimensioned and operative to preclude IR radiation from the IR lamp 22 from being reflected by the reflecting surface 26 back onto the IR lamp 22. Instead, such IR radiation, which would detrimentally affect the IR lamp 22, is transmitted outside of the lamp envelope 24 onto a mounting baffle 30 by means of the air gap 28. For the embodiment illustrated, the air gap 28 has a height of about 0.08 inches.

Figure 7:
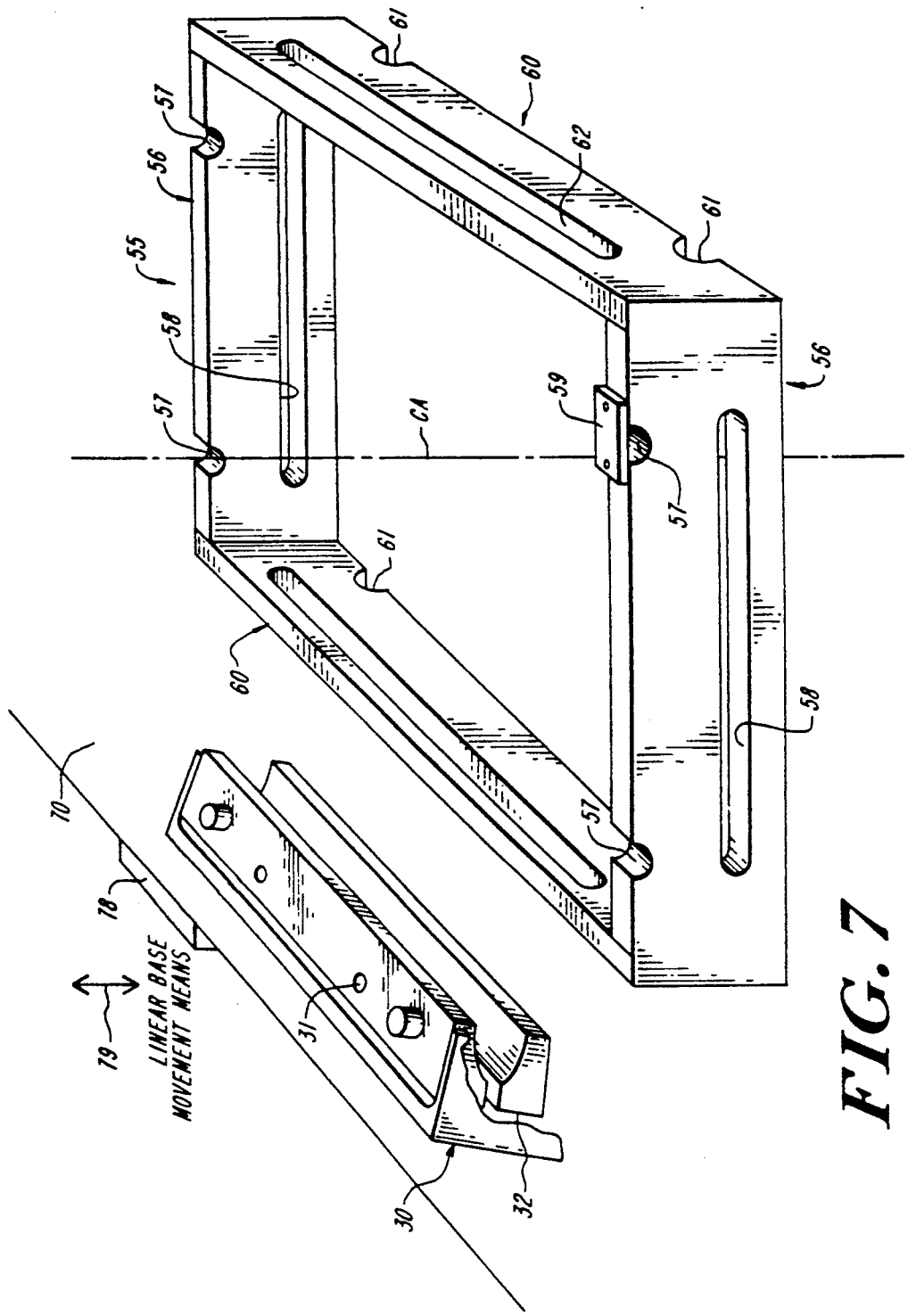
FIG. 7 is a partial perspective view illustrating the frame member and case of the IR heater array apparatus.

Each IR subassembly 20 is secured in combination with a mounting baffle 30 as exemplarily illustrated in FIG. 7. The baffle 30 is configured to perform several different functions. The baffle 30 is secured to the base 70 such that the corresponding IR subassembly 20 is disposed in a predetermined position as part of the IR heater array apparatus 10. The baffle 30 also includes means 31, such as push/pull screws, for aligning the IR subassembly 20. The baffle 30 is also operative to absorb and/or dissipate heat and radiation generated by the IR lamp 22.

Ceramic spacers 32 may be disposed between the rear of the lamp envelope 24 and the baffle 30 to create an air gap on the order of about 0.06 inches therebetween for heat dissipation. The ceramic spacers 32 cause the baffle to be canted slightly with respect to the rear of the lamp envelope 24 such that radiation passing through the air gap 28 is not reflected from the baffle 30 back through the air gap 28 onto the IR lamp 22.

As discussed hereinabove, only one surface 35rs of each reflecting member 35, that surface facing the corresponding IR subassembly 20, need be fabricated so as to reflect IR radiation. Each reflecting member 35 is mounted within a mirror frame 36 that is operative to rotatably adjust the mounted reflecting member 35 to align the focused IR radiation 16 with the bonding sites 15. Each mirror frame 36 includes sidewalls 38s, a rearwall 38b and a partial frontwall 38f as exemplarily illustrated in FIGS. 4 and 5. The partial frontwall 38f defines an aperture 40 that exposes the reflective surface 35rs of the internally mounted reflecting member 35 for reflecting radiation incident from the corresponding IR subassembly 20.

Figure 5:
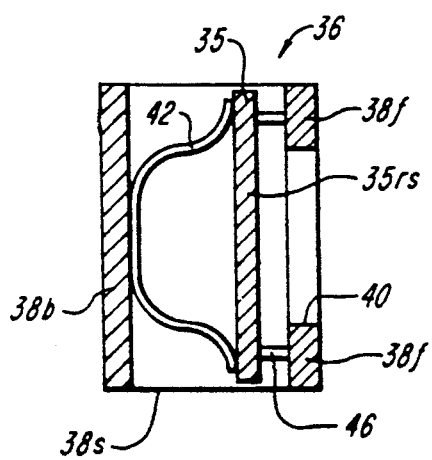
FIG. 5 is a cross-sectional view of the mirror frame of FIG. 4 taken along line 5—5.
Figure 6:
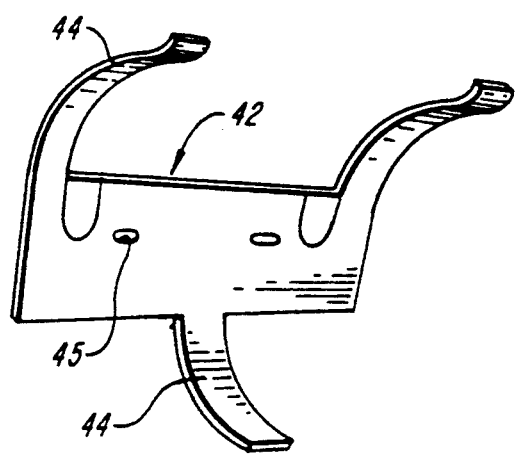
FIG. 6 is a perspective view of a mirror frame spring.

A mirror frame spring 42 having three biasing fingers 44, as shown in FIG. 6, is mounted within the mirror frame 36 by inserting screws through apertures 45 in the spring 42 to secure the spring 42 to the rearwall 38b of the mirror frame 36 (see FIG. 5). The surface of the reflecting member 35 opposite the reflective surface 35rs is disposed in abutting engagement with the biasing fingers 44 and held thereagainst by means of alignment screws 46. Manipulation of the screws 46 permits the reflective surface 35rs to be aligned to reflect the IR radiation generated by the corresponding IR subassembly 20 onto the bonding sites 15.

The reflecting members 35 may be removably mounted within the mirror frames 36. The upper sidewall 38s of each frame 36 may be fabricated as a partial sidewall, defining an opening 48 to permit removal/insertion of the reflecting member 35 within the mirror frame 36.

Extending from opposed sidewalls 38s are cylindrical shafts 50. The shafts 50 are utilized for mounting the mirror frame 36 with the frame member 55, and allow the mirror frame 36 to be rotated with respect to the frame member 55 for aligning the focused IR radiation with the bonding sites 15. The centerline of the shafts 50 coincides with the rotational axis 35r of the corresponding reflecting member 35 such that IR radiation from the respective IR subassembly 20 is reflected from the rotational axis 35r of the reflective surface 35s, thereby eliminating parallax.

With reference to FIG. 7, the frame member 55 is secured in combination with the base 70. The frame member 55, which may be fabricated from aluminum, consists of a first pair of opposed sidewalls 56 and a second pair of opposed sidewalls 60. Each sidewall 56 includes a pair of mounting channels 57 for rotationally mounting the y mirror frames 36 and a radiation slot 58 for passing IR radiation 16 from corresponding IR subassemblies 20. Likewise, each sidewall 60 includes a pair of mounting channels 61 for rotationally mounting the X mirror frames 36 and a radiation slot 62 for passing IR radiation 16 from corresponding IR subassemblies 20.

The respective mounting channels 57, 61 are configured to rotatably receive the cylindrical shafts 50 of the corresponding mirror frames 36. The dimensioning of the mounting channels 57, 61 and the mirror frames 36 and associated shafts 50 are such that when the mirror frames 36 are rotatably mounted in the respective mounting channels 57, 61, the rotational axis 35r of the reflecting surface 35rs is coincident with the principal ray 16 of the IR radiation 16 generated by the corresponding IR subassembly 20. Securing plates 59 are utilized to retain the cylindrical shafts 50 positioned within the respective mounting channels 57, 61.

To preclude interference between the opposed pairs of X, Y reflecting members 35X, 35Y during adjustment thereof, the X reflecting members 35X (as mounted in mirror frames 36) are rotatably mounted at a first level (mounting channels 61) in the frame member 55 and the y reflecting members 35Y are mounted at a second level (mounting channels 57) such that the X reflecting members 35X are lower than, and outboard (with respect to central axis CA) of, the y reflecting members 35Y. In addition, the respective mounting channels 57, 61 are positioned at different distances (about 2.9 inches versus 1.4 inches, see disclosure hereinbelow relating to positioning of the respective IR subassemblies 20) from the adjacent sidewall 60, 56, respectively.

These design constraints for the opposed pairs of reflecting members 35X, 35Y, which ensure interference-free adjustment of the X, Y reflecting members 35X, 35Y, impose additional constraints on the IR heater array apparatus 10 utilizing IR subassemblies 20 having identical focal lengths and which is configured so that the principal ray 16p of the IR radiation 16 is incident on the reflective surface 35rs of the respective reflecting member 35 at the rotational axis 35r thereof. These constraints include the positioning and width of the radiation slots 58, 62, formed in the respective sidewalls 56, 60, the spacing between each IR assembly 20 and corresponding sidewall 56, 60, and the lengths of the reflective surfaces 35rs of the X, Y reflecting members 35X, 35Y that are operative to reflect IR radiation 16.

The radiation slots 58, 62 are positioned and dimensioned to pass converging IR radiation generated by respective IR subassemblies 20 to provide focused IR radiation at the bonding sites 15 having substantially equivalent energy levels. Extraneous IR energy from the IR subassemblies 20 is blocked by the corresponding sidewalls 56, 60. For the embodiment illustrated, the radiation slots 58 in the first sidewalls 56 are formed adjacent the lower edge thereof (near the base 70) and have a minimum width of about 0.252 inches while the radiation slots 62 in the second sidewalls 60 are formed adjacent the top edge thereof and have a minimum width of about 0.378 inches. The spacing between the respective centerlines of the radiation slots 58, 62 for the embodiment illustrated is about 1.45 inches. The positioning and dimensioning of the radiation slots 58, 62 also ensures that the principal ray 16 of each IR subassembly 20 impinges upon the rotational axis 35r of the corresponding reflecting member 35.

The IR subassemblies 20 are spaced apart different distances from the adjacent sidewalls 56, 60. This results from the bi-level spacing and positioning of the opposed pairs of X, Y mirrors 35, and the utilization of IR subassemblies having the same focal length (about 7 inches for the embodiment described) which requires that the distance between each IR subassembly 20 and the corresponding bonding sites 15 be constant. For the embodiment illustrated, the IR subassemblies 20 adjacent the first sidewalls 56 are spaced apart therefrom a distance of about 2.1 inches, and the IR subassemblies 20 adjacent the second sidewalls 60 are spaced apart therefrom a distance of about 0.6 inches.

The lengths of the reflecting surfaces 35rs for the opposed pairs of X, Y reflecting members 35X, 35Y will generally be different. Typically, the X reflecting members 35X will extend almost completely between opposed sidewalls 60 while the Y reflecting members 35Y extend less than the distance between opposed sidewalls 56.

For each first sidewall 56, the centerlines of the adjacent IR lamp 22, the radiation slot 58 and the rotational axis 35r of the corresponding X reflecting member 35X lie in the same plane. Likewise, for each second sidewall 60, the centerlines of the adjacent IR lamp 22, the radiation slot 62 and the rotational axis 35r of the corresponding y reflecting member 35Y lie in the same plane. The foregoing configuration of the IR heater array apparatus 10 provides focused lines of IR radiation 16 at the X, Y orientated bonding sites 15 of substantially equivalent energy levels and with good thermal separation, thereby precluding unwanted illumination and heating of the IC device 14 and/or the printed circuit board 12.

Figure 8:
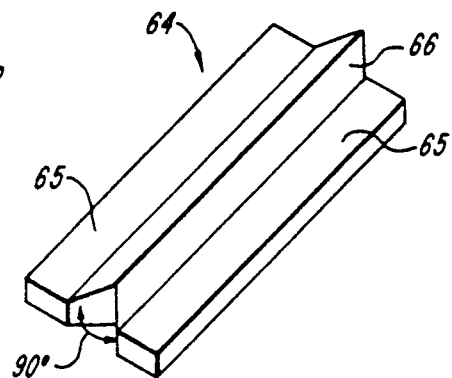
FIG. 8 is a perspective view of a radiation shield for the IR heater array apparatus.
Figure 4:
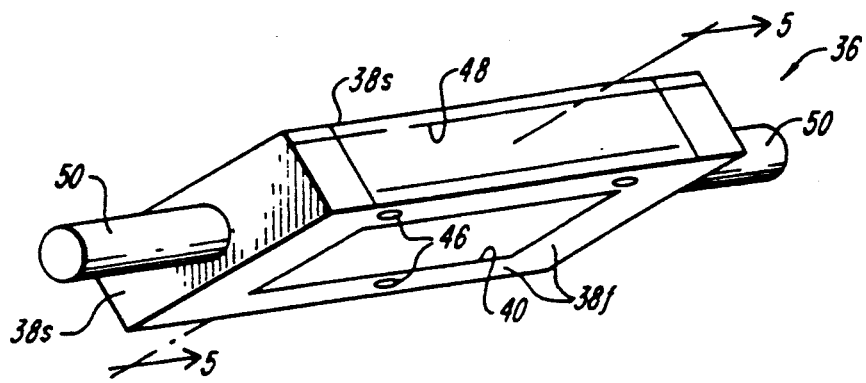
FIG. 4 is a perspective view of a mirror frame.

The IR heater array apparatus 10 of the present invention may be utilized to provide focused lines IR radiation for reflow bonding for IC devices 14 of different sizes and/or IC devices 14 having X, Y orientated bonding sites 15 of different lengths. A shield 64, as illustrated in FIG. 8, may be disposed in slidable combination with each radiation slot 58, 62. A radiation reflecting portion 66 of the shield 64 faces the corresponding IR subassembly 20 and is operative to block/reflect IR radiation emitted by the IR subassembly 20, thereby varying the effective length of the radiation slot 58, 62 that is operative to pass IR radiation. Opposed edges 65 of the shield 64 are disposed in corresponding tracks (not shown for clarity) positioned on each sidewall 56, 60 above and below the corresponding radiation slot 58, 62. Each shield 64 is slidably movable, either manually or remotely by conventional means, to vary the effective length of the corresponding radiation slot 58, 62.

Preferably, two shields 64 are utilized with each radiation slot 58, 62. This allows the effective length of the radiation slot 58, 62 to be centered at the midpoint of the radiation slot 58, 62.

The opposed X reflecting members 35X are slaved together for adjusting the plane of incidence of the focused lines of IR radiation with the X orientated bonding sites. The opposed Y reflecting members 35Y are likewise adjustably slaved together for adjusting the plane of incidence of the focused lines IR radiation with the Y orientated bonding sites. The adjusting mechanism 85 for changing the reflective angle for each of the opposed pairs of reflecting members 35X, 35Y is illustrated in FIGS. 9 and 10.

The adjusting mechanism 85 includes a cylindrical master unit 86 mounted in combination with one end of the shaft 50 of one X (or Y) mirror frame 36, a cylindrical slave unit 87 mounted in combination with the corresponding end of the shaft 50 of the other X (or Y) mirror frame 36, and a belt 88 having the ends thereof secured to the master and slave units 86, 87, respectively, to link the units 86, 87 together. The master unit 86 may be rotated either clockwise (CW) or counterclockwise (CCW) to adjust the reflective angle of the corresponding reflecting member 35. The slave unit 87 is rotated through an equivalent angle by means of the belt 88 to coincidentally adjust the reflective angle of the paired reflecting member 35. A torsion spring 89 is mounted in combination with the slave unit 87 to provide a biasing force to rotate the slave unit 87 in a CW direction when the master unit 86 is rotated in the CCW direction.

The master unit 86 includes a conventional adjusting-/locking means 90. The adjusting/locking means 90 is operative to rotate the master unit 86 in either a CW or CCW direction to adjust the reflective angle of the opposed pair of reflecting members 35. The adjusting-/locking means 90 is also operative to lock the master unit 86 in the adjusted position. As illustrated in the drawings, the master unit 86 is manually adjustable to change the reflective angle. It will be appreciated that the adjusting/locking means 90 may be operated automatically by means of a remote control unit (not shown).

For the embodiment illustrated, the y reflecting members 35Y are initially positioned to provide a nominal reflective angle of about 45° such that the principal ray 16p is reflected approximately 90°. Since the X reflecting members 35X (the lower pair of mirrors) are mounted outwardly of the y reflecting members 35Y, the X reflecting members 35X must be nominally positioned to reflect IR radiation slightly inwardly (through an angle slightly greater than 90°). The adjusting mechanism 85 provides the capability to rotate the reflecting members 35 through an angle of about plus or minus 8° from the nominal position, i.e., about 37°–53° for the Y reflecting members 35Y.

The base 70 is configured for mounting the IR heater array apparatus 10 in combination with the placement head of a placement apparatus. The base 70 provides the infrastructure for concentrically mounting the IR subassemblies 20 and the frame member 55 with the placement head.

As discussed hereinabove, the IR subassemblies 20 are configured and disposed to provide focused lines of IR radiation having a constant focal length. It will be appreciated that any time the reflective angle of either X or Y reflecting members 35 is varied, the plane of incidence of the focused lines of IR radiation will be shifted slightly. To ensure that the plane of incidence of the focused lines of IR radiation coincides with the bonding sites, the base 70 is slidably mounted for Z-movement (perpendicular movement with respect to the circuit board) to permit vertical spacing adjustments of the bonding sites. As schematically illustrated in FIG. 7, a means 78 for effecting linear movement, such as a worm gear arrangement, is disposed in combination with the base 70 to effect Z-movement thereof to change the vertical spacing between the base 70 and the circuit board, as illustrated by reference numeral 79.

The IR heater array apparatus described hereinabove is a relatively simple, adjustable, easily operable mechanism for providing focused IR radiation for soldering IC devices to printed circuit boards. The apparatus 10 provides focused IR radiation with good thermal separation at the bonding sites and provides the capability for precisely regulating the reflow bonding operation. The IR heater array apparatus may be utilized with conventional placement apparatus, and is especially well suited for use with a guidance type placement apparatus as described in the aforesaid commonly owned, co-pending application U.S. Ser. No. 07/573,459. The IR heater array apparatus of the present invention is well suited for reflow bonding operations with a wide variety of IC package configurations, and is especially well-suited for deep cavity applications.

Another embodiment of the invention employs an IR subassembly having a linear IR lamp and associated lamp envelope cooperative with a lens for focusing the linear lamp radiation to provide a heat pattern directed essentially only onto the lead arrays of the device being worked on. The IR subassemblies are adjustable in the X, Y and Z directions to selectively provide a perimeter pattern of energy according to the particular size and configuration of the device being worked on.

Referring to FIG. 11, the rectangular array of four IR subassemblies 100 is illustrated applying heat to the leads 102 of an IC 104. In FIG. 11, which illustrates the principal of this embodiment of the invention, each IR subassembly 100, includes a linear IR lamp 106 disposed proximate an associated lamp envelope 108. Intermediate the IR subassembly and respective array of leads 102 is a lens 110.

IR radiation 112 from each IR subassembly 100 is directed towards cylindrical lens 110, either directly or by reflection via reflective surface 108rs of the respective lamp envelope 108. The lenses 110 focus IR radiation 112 into converging IR radiation having a focal plane colinear with the bonding site 116 of leads 102.

Referring now also to FIG. 12, first and second IR subassemblies 120 are illustrated with respective cylindrical lenses 122 shown mounted with respect to associated heat shrouds 124 which, in turn, are attached to lamp envelopes 126. Lenses 122 are retained in desired angular relationship with IR lamps 128 by brackets 130 attached to heat shroud 124.

Lenses 122, in this embodiment, are doublet lenses which have been shown to provide superior linear focusing of IR radiation 132X, 132Y into focal planes fp colinear with bonding sites 134X, 134Y. Doublet lenses 122 are fused silica or quartz lenses and, given the present configuration of IC devices, may be 3" long and having a width of 1'. The distance between the axis of IR lamp 128 and lens 122 is approximately 1½". The distance from the axes of lenses 122 to the respective bonding sites 134X, 134Y is approximately 3".

The reflecting surface 136rs of lamp envelope 126 is a polished aluminum surface or may be gold plate or such other material having the same or better degree of radiation reflectivity and may be provided having a parabolic shape IR lamps 128 have a power input of 1KW. Although not shown, IR lamps having such power input should be shielded as necessary to prevent damage to the human eye. Heat envelope 126 is cooled by heat sink 138. Cooling is improved by forcing compressed air, through a venturi, via input 144, around heat sink 138 and through heat sink cooling channels 142. Compressed air exits via exhaust 140. Rising slope 143 is calculated to provide near uniform air flow through cooling channels 142. Cooling channels 142 are of varied depths to further provide uniform air flow. An airtight cover (not shown) is placed over the top 145 of heat envelope 126 to ensure adequate air flow and cooling. A heat-sensitive device may be disposed in cavity 146 of lamp envelope 126 to monitor the temperature of heat envelope 126 and may be programmed to shut down the operation of IR subassembly 120 if overheating occurs. Heat shroud 124 prevents unwanted heat loss. To decrease end effect and to limit the line of IR radiation 132X, 132Y along respective bonding sites 134X, 134Y, a right-angle baffle 147 may be placed outwardly adjacent the intersection of bonding sites 134X, 134Y. Baffle 147 also reduces undesired heating of nearby devices, solder and the like. Baffle 147 has been shown to be effective when located at approximately 0.25" above bonding sites 134X, 134Y.

IR subassemblies are adjustable in the X, Y, and Z directions to provide a line-focused heating source directing at bonding sites 134X, 134Y. X/Y direction adjustability enables this embodiment to be utilized for applying line focused heat to a wide range of IC package configurations, both square and rectangular, without retooling. Adjustability in the Z direction provides vertical clearance to accommodate wide variations in local topography. In practice, given the present configuration of IC devices, lower edge 146 of heat shroud 124 is disposed at about 0.8 to 1 inch above bonding sites 134X, 134Y to provide a crisp definition of focused IR radiation to the work site and to minimize the unwanted application of heat to the IC device body and adjacent components.

Typical melting points for the solder used to bond IC devices is approximately 180 degrees centigrade. The present invention is selectively adjustable to first preheat bonding sites 134X, 134Y to approximately 150 degrees centrigrad at low power prior to the use of high power to increase bonding site temperatures to above the melting point of solder. Preheating may also be applied by other heat sources and from beneath the IC device prior to high-power heating by the present invention.

A variety of modifications and variations of the present invention are possible in light of the above teachings. It is therefore to be understood that within the scope of the appended claims, the present invention may be practiced otherwise than as specifically described hereinabove.

What is claimed is:

1. An IR heater apparatus for use in combination with a placement apparatus having a placement head to provide thermal energy at bonding sites for soldering or desoldering an IC device to or from a printed circuit board, comprising:
    first and second IR sources for generating IR radiation having a predetermined heating pattern and sufficient thermal energy for soldering the IC device to the printed circuit board;
    a first lens disposed between said said first IR source and the IC device;
    a second lens disposed between said said second IR source and the IC device;
    first and second alignment assemblies, each of said first and second alignment assemblies coupled to a respective one of said first and second IR sources;
    wherein said first and second alignment assemblies are disposed to direct IR radiation from said first and second IR sources toward said printed circuit board, wherein said first and second alignment assemblies move cooperatively to direct the IR radiation from the first and second IR radiation sources toward said printed circuit board.

2. The IR heater apparatus of claim 1 wherein each of said first and second IR radiation sources comprises
    an IR lamp for generating IR radiation having a predetermined energy level; and
    a director having a first surface and a second surface disposed about said IR lamp for directing said generating IR radiation toward said lens.

3. The IR heater apparatus of claim 2 wherein the first surface of said director is provided having a parabolic shape.

4. The IR heater apparatus of claim 2 wherein said first surface of said director is provided having a hemi-elliptical shape and wherein said IR lamp is disposed at one foci of said hemi-elliptical surface.

5. The IR heater apparatus of claim 1 wherein each of said first and second IR sources are concentrically disposed about and spaced apart from the placement head and each of said first and second IR sources includes:
    an IR lamp for generating IR radiation having a predetermined energy level;
    a lamp envelope disposed in combination with said IR lamp, said lamp envelope having a reflecting surface of predetermined configuration for directing said IR radiation generated by said IR lamp toward the corresponding one of said first and second lenses;
    wherein each of said lamp envelopes and said IR lamps in combination define first and second IR subassemblies, each of said first and second IR subassemblies.

6. The IR heater apparatus of claim 5 wherein:
    said first alignment assembly comprises a first reflecting member disposed to reflect said IR radiation provided by a first one of said first and second IR subassemblies, said first reflecting member rotatably adjustable to coincidentally align heating patterns with bonding sites oriented in a first linear direction; and
    said second alignment assembly comprises a second reflecting member disposed to reflect said IR radiation provided by a second one of said first and second IR subassemblies, said second alignment member rotatably adjustable in response to rotation of said first alignment member, to coincidentally align heating patterns with bonding sites oriented in a second linear direction.

7. The IR heater apparatus of claim 6 further comprising:
    a frame member having opposed pairs of sidewalls configured for rotatably mounted said first and second reflecting members.

8. The IR heater apparatus of claim 7 wherein each sidewall includes a radiation slot for transmitting IR radiation from said respective IR subassembly to said respective reflecting member.

9. The IR heater apparatus of claim 8 further comprising shield means disposed in slidable combination with each of said radiation slots, said shield means for varying the effective length of said slot and for transmitting focused IR radiation wherein said predetermined length of said predetermined heating pattern is changed.

10. The IR heater apparatus of claim 6 further comprising an adjusting mechanism means disposed in combination with each of said first and second reflecting members for rotatably adjusting each of said first and second reflecting members, respectively, to change the reflective angle thereof.

11. An IR heater array comprising:
    a first IR radiation source;
    a second IR radiation source oppositely disposed said first IR radiation source;
    a first frame disposed proximate to said first IR radiation source;
    a first reflector disposed in said first frame said first reflector for directing IR radiation provided by said first IR radiation source;
    a second frame disposed proximate to said second IR radiation source;

a second reflector disposed in said second frame said second reflector for directing IR radiation provided by said second IR radiation source;
a first rotatable cylinder coupled to said first frame;
a second rotatable cylinder coupled to said second frame; and
a belt having a first end coupled to said first cylinder and a second end coupled to said second cylinder.

12. The IR heater array of claim 11 further comprising a first and second lens each lens disposed proximate a corresponding one of said first and second IR sources.

13. The IR heater array of claim 11 wherein said first and second IR radiation sources each comprises a plurality of IR subassemblies, each IR subassembly comprising:
an IR lamp for generating IR radiation having a predetermined energy level; and
a lamp envelope disposed in combination with said IR lamp and said lamp envelope having a reflecting surface of predetermined configuration for directing said generated IR radiation.

14. The IR heater array of claim 13 further comprising:
a first shaft coupled to said first frame; and
a second shaft coupled to said second frame wherein said first cylinder is coupled to said first frame through said first shaft and said second cylinder is coupled to said second shaft through said second shaft and wherein the first cylinder is coupled to a first side of the first end of said belt and the second cylinder is coupled to a second side of the second end of said belt.

15. The IR heater array of claim 13 wherein:
said predetermined configuration of said reflecting surface is hemi-elliptical; and
said IR lamp is disposed at one foci of said hemi-elliptical reflecting surface.

16. The IR heater array of claim 11 wherein said first and second IR radiation source each comprise:
first and second pairs of opposed IR lamps disposed about and spaced apart from a placement head, each of said IR lamps generating IR radiation having a predetermined energy level; and
a lamp envelope disposed in combination with each of said IR lamps, each of said lamp envelopes having a reflecting surface of predetermined configuration for directing said IR radiation generated by said corresponding IR lamp to provide said IR radiation;
each of said lamp envelopes and said IR lamps in combination defining an IR subassembly for providing said IR radiation.

17. The IR heater array of claim 16 further comprising:
a first opposed pair of reflecting members disposed to reflect said focused IR radiation provided by one opposed pair of associated IR subassemblies and rotatably adjustable to coincidentally align said heating patterns thereof with bonding sites orientated in a first linear direction; and
a second opposed pair of reflecting members disposed to reflect said focused IR radiation provided by the other opposed pair of associated IR subassemblies and rotatably adjustable to coincidentally align said heating patterns thereof with bonding sites orientated in a second linear direction.

18. The IR heater array apparatus of claim 17 wherein said first and second frames comprise:
first and second opposed pairs of sidewalls wherein said first and second shafts are disposed through a first one of the first and second pairs of sidewalls of the corresponding frame.

19. The IR heater array apparatus of claim 18 wherein each sidewall is provided having a radiation slot therethrough for transmitting focused IR radiation from said respective IR subassembly to said respective reflecting member.

20. The IR heater array apparatus of claim 18 further comprising a shield disposed about at least one sidewall of said frame said shield for varying the effective length of the radiation slot.

* * * * *

UNITED STATES PATENT AND TRADEMARK OFFICE
CERTIFICATE OF CORRECTION

PATENT NO. : 5,278,938

DATED : January 11, 1994

INVENTOR(S) : Donald J. Spigarelli, et al

It is certified that error appears in the above-indentified patent and that said Letters Patent is hereby corrected as shown below: On the title page: Item [54] and Column 1, lines 2 thru 3, "Infrared Heater Array For IC Soldering Reflective Members" should read --INFRARED HEATER ARRAY FOR IC SOLDERING UTILIZING REFLECTIVE MEMBERS--.

Column 1, line 11, "placement" should read --Placement--; and "pitch" should read --Pitch--.

Column 3, line 62, "sides." should read --sites.--.

Column 4, line 15, "placement" should read --Placement--.

Column 4, line 16, "pitch" should read --Pitch--.

Column 4, line 36, "pairs of X, U" should read --pairs of X, Y--.

UNITED STATES PATENT AND TRADEMARK OFFICE
CERTIFICATE OF CORRECTION

PATENT NO. : 5,278,938
DATED : January 11, 1994
INVENTOR(S) : Donald J. Spigarelli, et al It is certified that error appears in the above-indentified patent and that said Letters Patent is hereby corrected as shown below:

Column 6, line 22, "Of the" should read --of the--.

Column 6, line 40, "control U means" should read --control means--.

Column 7, line 3, "y +/- (b/a)(a$^2$-x$^2$)$^{178}$" should read --y +/- (b/a)(a$^2$-x$^2$)$^{1/2}$--.

Column 12, line 10, "principal" should read --principle--.

Column 12, line 43, "shape IR" should read --shape. IR--.

Column 14, line 39, "mounted" should read --mounting--.

Signed and Sealed this

Twenty-seventh Day of September, 1994

Attest:

*Attesting Officer*

BRUCE LEHMAN

*Commissioner of Patents and Trademarks*